United States Patent
Ohtani

(10) Patent No.: US 6,733,584 B1
(45) Date of Patent: *May 11, 2004

(54) METHOD OF FORMING CRYSTALLINE SILICON FILM

(75) Inventor: Hisashi Ohtani, Kanagawa (JP)

(73) Assignee: Semiconductor Energy Laboratory Co., Ltd., Atsugi (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 393 days.

(21) Appl. No.: 08/995,368

(22) Filed: Dec. 22, 1997

(30) Foreign Application Priority Data

Dec. 27, 1996 (JP) .............................................. 8-358973

(51) Int. Cl.[7] .................................................. C30B 1/06
(52) U.S. Cl. ............................. 117/8; 117/9; 117/930
(58) Field of Search ................................. 117/8, 9, 930

(56) References Cited

U.S. PATENT DOCUMENTS

| | | | |
|---|---|---|---|
| 5,403,772 A | * 4/1995 | Zhang et al. ................... 117/8 |
| 5,426,064 A | * 6/1995 | Zhang et al. ................... 437/40 |
| 5,481,121 A | * 1/1996 | Zhang et al. ................... 257/64 |
| 5,488,000 A | 1/1996 | Zhang et al. ................... 437/21 |
| 5,492,843 A | 2/1996 | Adachi et al. ................... 437/21 |
| 5,501,989 A | 3/1996 | Takayama et al. ............. 437/21 |
| 5,508,533 A | 4/1996 | Takemura ..................... 257/64 |
| 5,529,937 A | 6/1996 | Zhang et al. ................... 437/10 |
| 5,534,716 A | * 7/1996 | Takemura ..................... 257/72 |
| 5,543,352 A | * 8/1996 | Ohtani et al. ................. 117/930 |
| 5,563,426 A | 10/1996 | Zhang et al. ................... 257/66 |
| 5,569,610 A | 10/1996 | Zhang et al. ................... 437/21 |
| 5,569,936 A | 10/1996 | Zhang et al. ................... 257/66 |
| 5,580,792 A | 12/1996 | Zhang et al. ................... 437/10 |
| 5,585,291 A | * 12/1996 | Ohtani et al. ................... 117/8 |
| 5,589,694 A | 12/1996 | Takayama et al. ............. 257/67 |
| 5,595,923 A | 1/1997 | Zhang et al. ................... 437/41 |
| 5,595,944 A | 1/1997 | Zhang et al. ................... 437/41 |
| 5,604,360 A | 2/1997 | Zhang et al. ................... 257/72 |
| 5,605,846 A | 2/1997 | Ohtani et al. ................... 437/21 |
| 5,606,179 A | 2/1997 | Yamazaki et al. ............. 257/59 |
| 5,608,232 A | 3/1997 | Yamazaki et al. ............. 257/66 |
| 5,612,250 A | 3/1997 | Ohtani et al. ................... 437/101 |
| 5,614,426 A | 3/1997 | Funada et al. ................. 437/40 |
| 5,614,733 A | 3/1997 | Zhang et al. ................... 257/66 |
| 5,616,506 A | 4/1997 | Takemura ..................... 438/150 |
| 5,620,910 A | 4/1997 | Teramoto ..................... 438/151 |
| 5,621,224 A | 4/1997 | Yamazaki et al. ............. 257/66 |
| 5,624,851 A | 4/1997 | Takayama et al. ............. 438/166 |
| 5,637,515 A | 6/1997 | Takemura ..................... 438/162 |
| 5,639,698 A | 6/1997 | Yamazaki et al. ............. 437/228 |
| 5,643,826 A | 7/1997 | Ohtani et al. ................... 437/88 |
| 5,646,424 A | 7/1997 | Zhang et al. ................... 257/66 |
| 5,654,203 A | 8/1997 | Ohtani et al. ................... 438/97 |
| 5,656,825 A | 8/1997 | Kusumoto et al. ............. 257/66 |
| 5,663,077 A | 9/1997 | Adachi et al. ................. 438/151 |

(List continued on next page.)

Primary Examiner—Robert Kunemund
(74) Attorney, Agent, or Firm—Fish & Richardson P.C.

(57) ABSTRACT

To provide a method of promoting quality of crystals and increasing growth rate in a process of carrying out crystal growth in a horizontal direction of an amorphous silicon film by using a catalyst element expediting crystallization, in respect of the amorphous silicon film for carrying out horizontal growth by using a catalyst element of nickel or the like, irregularities of a matrix (underlayer film or substrate) in contact with the amorphous silicon film are made smaller than the film thickness of the amorphous silicon film by which crystal growth occurs substantially entirely by the catalyst element and interruption of growth caused by natural crystallization or the irregularities of a matrix can be prevented.

12 Claims, 5 Drawing Sheets

U.S. PATENT DOCUMENTS

| | | | | |
|---|---|---|---|---|
| 5,677,549 | A | 10/1997 | Takayama et al. | 257/66 |
| 5,696,386 | A | 12/1997 | Yamazaki | 257/57 |
| 5,696,388 | A | 12/1997 | Funada et al. | 257/64 |
| 5,700,333 | A | 12/1997 | Yamazaki et al. | 136/258 |
| 5,705,829 | A | 1/1998 | Miyanaga et al. | 257/66 |
| 5,712,191 | A | 1/1998 | Nakajima et al. | 437/174 |
| 5,744,822 | A | 4/1998 | Takayama et al. | 257/66 |
| 5,744,824 | A | 4/1998 | Kousai et al. | 257/74 |
| 5,756,364 | A | 5/1998 | Tanaka et al. | 437/21 |
| 5,766,977 | A | 6/1998 | Yamazaki | 438/151 |
| 5,773,327 | A | 6/1998 | Yamazaki et al. | 438/154 |
| 5,773,846 | A | 6/1998 | Zhang et al. | 257/66 |
| 5,773,847 | A | 6/1998 | Hayakawa | 257/66 |
| 5,783,468 | A | 7/1998 | Zhang et al. | 438/166 |
| 5,795,795 | A | 8/1998 | Kousai et al. | 437/174 |
| 5,808,321 | A | 9/1998 | Mitanaga et al. | 257/72 |
| 5,811,327 | A | 9/1998 | Funai et al. | 438/166 |
| 5,814,540 | A | 9/1998 | Takemura et al. | 438/166 |
| 5,818,076 | A | 10/1998 | Zhang et al. | 257/255 |
| 5,821,138 | A | 10/1998 | Yamazaki et al. | 438/150 |
| 5,824,573 | A | 10/1998 | Zhang et al. | 438/150 |
| 5,824,574 | A | 10/1998 | Yamazaki et al. | 438/254 |
| 5,830,784 | A | 11/1998 | Zhang et al. | 438/154 |
| 5,837,619 | A | 11/1998 | Adachi et al. | 438/795 |
| 5,840,118 | A | 11/1998 | Yamazaki | 117/103 |
| 5,843,225 | A | 12/1998 | Takayama et al. | 227/8 |
| 5,843,833 | A | 12/1998 | Ohtani et al. | 117/8 |
| 5,851,862 | A | 12/1998 | Ohtani et al. | 438/166 |
| 5,858,823 | A | 1/1999 | Yamazaki et al. | 438/166 |
| 5,869,362 | A | 2/1999 | Ohtani | 438/166 |
| 5,869,363 | A | 2/1999 | Yamazaki et al. | 438/166 |
| 5,879,977 | A | 3/1999 | Zhang et al. | 438/166 |
| 5,882,960 | A | 3/1999 | Zhang et al. | 438/166 |
| 5,886,366 | A | 3/1999 | Yamazaki et al. | 257/59 |
| 5,888,857 | A | 3/1999 | Zhang et al. | 438/162 |
| 5,888,858 | A | 3/1999 | Yamazaki et al. | 438/162 |
| 5,897,347 | A | 4/1999 | Yamazaki et al. | 438/166 |
| 5,904,770 | A | 5/1999 | Ohtani et al. | 117/103 |
| 6,107,639 | A | 8/2000 | Yamazaki et al. | |
| 6,396,105 | B1 | 5/2002 | Yamazaki et al. | |

* cited by examiner

METHOD OF FORMING CRYSTALLINE SILICON FILM

BACKGROUND OF THE INVENTION

1. Field of the Invention

The present invention relates to a method of forming a crystalline silicon film formed on an insulating substrate of glass or the like, a semiconductor substrate of a single crystal silicon substrate or the like. Particularly, the present invention relates to a method of providing a crystalline silicon film in a preferable crystal state in which in a method of crystallizing an amorphous silicon film by annealing, horizontal growth is performed by using a catalyst element promoting crystallization (nickel or the like).

2. Description of Prior Art

A crystalline silicon film is a material indispensable in a semiconductor element of a thin film transistor or the like. It has been known in recent years that a silicon film having excellent crystalline performance can be obtained at a lower temperature in a short period of time by using a metal element having a function of promoting to crystallize an amorphous silicon film (catalyst element). Nickel (Ni), platinum (Pt), palladium (Pd), copper (Cu), silver (Ag), iron (Fe) or the like is effective as the catalyst element.

Particularly, there has been known a technology of providing a silicon film having a crystal structure preferable to an element by controlling a direction of crystal growth by nonselectively introducing a catalyst element (for example, Japanese Unexamined Patent Publication Nos. JP-A-7-45519 and JP-A-8-213634). The technology is referred to as a horizontal growth process. According to the horizontal growth process, crystal grain boundaries are present in parallel with a direction of growth and the effect of the grain boundaries can be lowered to a limit thereof by making a direction of current of an element in parallel with the direction of growth. As a result, a characteristic equivalent to that of a single crystal material can be provided even for a polycrystal material.

A simple explanation will be given of the horizontal growth process. According to the horizontal growth process, a mask film of silicon oxide or the like is formed on an amorphous silicon film and a window is selectively formed in the film. A catalyst element is introduced from the window. In FIG. 1(A), the window is designated by numeral 11. Further, a film of a catalyst element per se or a compound thereof is formed by various methods of a sputtering process (Japanese Unexamined Patent Publication Nos. JP-A-7-45519 and JP-A-7-66425) a gas phase growth process (Japanese Unexamined Patent Publication No. JP-A-7-335548), a coating process (Japanese Unexamined Patent Publication No. JP-A-7-130652) and the like.

Further, when crystallization is performed by carrying out an annealing process, a region (horizontal growth region) 13 of crystalline silicon is widened centering on the window. This is caused since the catalyst element makes the amorphous silicon film crystallize while diffusing in the silicon film. Generally, the higher the temperature, the longer the time period, the further the crystallization is progressed. (FIG. 1(A): details are described in Japanese Unexamined Patent Publications, mentioned above.)

By arranging the direction of horizontal growth in relation with a direction of flowing current in a semiconductor element such as a thin film transistor (TFT), the characteristic of the semiconductor can be promoted. That is, there are several variations in arranging TFT. One of the variations is shown by FIG. 3. In FIG. 3, numeral 301 designates a window portion to which a catalyst element is added and a crystallized region 302 is widened by horizontal growth at the surrounding of the window centering on the window portion.

In this case, when the window portion 301 is provided with a rectangular shape, a horizontal growth region in an elliptic shape is formed as shown by FIG. 3. in that case, a gate electrode 304 may be made substantially in parallel with the region 301 as shown by TFT1 of FIG. 3 and crystal growth may be carried out in a direction of from a drain 305 to a source 303 or in a reverse direction thereof.

Further, as shown by TFT2 of FIG. 3, a gate electrode 307 may be arranged substantially orthogonally to the region 301 and crystal growth may be carried out substantially simultaneously at a source 306 and a drain 308. As a characteristic of TFT, according to the former method, ON current is large since directions of crystal growth and current are in parallel with each other and according to the latter method, OFF current is large since the directions of crystal growth and current are orthogonal to each other. (FIG. 3)

Further, the catalyst element may be added linearly by forming the window in a linear shape. FIGS. 4(A) and 4(B) show an example where catalyst adding regions 401 and 406 are provided in parallel with gate lines 402 and 407 in a circuit including a number of TFTs. FIG. 4(A) corresponds to TFT2 of FIG. 3 where the catalyst element is added substantially orthogonally to gate electrodes of TFTs 403 through 405. FIG. 4(B) corresponds to TFT1 of FIG. 3 where the catalyst element is added substantially in parallel with gate electrodes of TFTs 408 through 410. (FIGS. 4(A) and 4(B))

Such a control of the direction of crystal growth by means of the horizontal growth process is effective in a high degree semiconductor integrated circuit where elements to which mutually contradictory functions are requested, are formed on the same substrate. FIG. 5 shows a block diagram of a monolithic type active matrix circuit used in a liquid crystal display. A source driver (row driver) and a gate driver (column driver) are installed as peripheral driver circuits.

Further, a number of pixel circuits comprising transistors for switching and capacitors are formed in the active matrix circuit (pixel) region and pixel transistors of the matrix circuit and the peripheral driver circuits are connected to each other by source lines and gate lines having numbers the same as a number of rows and a number of columns. High speed operation is requested to TFTs used in the peripheral circuits, particularly peripheral logical circuits of shift resistors and the like and accordingly, large current (ON current) and small dispersion are requested in selecting operation.

Meanwhile, it is requested to TFTs used in the pixel circuit that leakage current (also referred to as OFF current) is sufficiently low and dispersion is small in nonselecting operation, that is, when reverse bias voltage is applied to gate electrodes such that electric charge accumulated in capacitors are held for a long period of time. Specifically, it is requested that OFF current is equal to or lower than 1 pA and dispersion is within one digit. Conversely, rot so large ON current is needed.

As described above, TFTs having physically contradictory characteristics of high ON current and low leakage current, and small dispersion of these, are formed on the same substrate at the same time. However, it is easily understood that such requirements are very difficult to satisfy technically according to a normal crystallizing process.

By contrast, when the crystallizing direction is controlled by the horizontal growth process, these problems can be resolved (Japanese Unexamined Patent Publication No. JP-A-8-213634). In this way, the effectiveness of the horizontal growth process using the catalyst element is shown.

Ideally, when annealing operation is carried out at a higher temperature for a longer period of time, infinitely large horizontal growth can be provided, however, in that case, it has been observed that although the region of horizontal growth is enlarged, the quality of crystals is deteriorated as a whole. The behavior is shown by FIG. 1(B). FIG. 1(B) shows a behavior of continuing horizontal growth further from a state shown by FIG. 1(A) where the horizontal growth region 13 is enlarged to a portion of an ellipse of a bold line designated by numeral 14 (in the case of FIG. 1(A), a portion of an ellipse of a dotted line designated by numeral 12 in the figure).

However, regions where disturbance in crystalline performance is caused (indicated by black points 15 in FIG. 1(B)) emerge particularly at portions remote from the window. (FIG. 1(B))

Generally, the concentration of the catalyst element is high at the window 11 and a vicinity thereof and it is preferable to avoid a situation where the region overlaps major portions of elements. According to the current technology, in the horizontal growth process using nickel as a catalyst element, the width of horizontal growth having no disturbance of crystals is 50 through 60 Mm at a maximum, however, when an element is enlarged, the horizontal growth region needs to be enlarged further. It is an object of the present invention to provide annealing conditions for obtaining a larger horizontal growth region while reducing a deterioration in the crystalline performance.

SUMMARY OF THE INVENTION

According to crystallization by means of a conventional annealing process, the larger the irregularities of a substrate, the easier the crystallization is performed and the shorter the crystal growth time period. This seems to be due to the fact that the irregularities function as nuclei of crystallization.

However, the inventors have found from various experimental results that in the horizontal growth process, the irregularities of the substrate deteriorate the quality of crystals and lowers the rate of horizontal growth and therefore, the smaller the irregularities of the substrate as less as possible, the more preferable.

According to a research by the inventors, it has been clarified that the quality of crystals can sufficiently be promoted when a root mean square of a surface roughness of an underlayer film or a substrate that is brought into contact with a bottom face of an amorphous silicon film which is intended to crystallize by a horizontal growth process is smaller than a thickness of the amorphous silicon film.

The result is an epoch making discovery in view of the fact that conditions which have been regarded as disadvantageous according to the conventional crystallizing technology are preferable conditions.

Further, preferable conditions are provided in respect of the density of projections present on the substrate or the underlayer film. The main reason for interrupting horizontal growth when the horizontal growth is carried out on an ideal substrate resides in generation of nuclei caused by natural crystallization (crystallization not dependent upon the operation of catalyst element) of the amorphous silicon film.

A time period of initializing natural crystallization at a specific annealing temperature can be specified. When the annealing operations performed for a time period exceeding the above-described time period, the horizontal growth is interrupted by natural crystallization and therefore, a maximum horizontal growth distance is determined by the annealing temperature.

An equation of a relationship between an annealing temperature and an annealing time period under a critical condition of natural crystallization is specified below.

$t=f(T)$ ($T$: annealing temperature, $t$: annealing time period)

For example, when an amorphous silicon film having a surface roughness of 80 nm (rms: root mean square) is annealed at 600° C., the amorphous silicon is naturally crystallized in 4 hours. Similar investigation has been performed in respect of other temperature by which, for example, the result shown by FIG. 1(C) is obtained.

The curve generally differs in accordance with the fabrication method even with the same amorphous silicon film. For example, an amorphous silicon film produced by low pressure CVD process is difficult to crystallize more than an amorphous silicon film produced by plasma CVD process and the curve is moved to the upper right direction.

Further, an equation of a relationship between the annealing temperature and a distance of growth is specified below.

$x=g(T, t)$ ($x$: distance of growth)

A maximum horizontal growth distance $x_0$ at an annealing temperature $T0$ is obtained as specified below.

$x_0=g(T, f(T))$

Incidentally, the maximum horizontal growth distance signifies a conceptual meaning where no defects are present in crystals which is not the same as an actual horizontal growth distance.

Accordingly, the horizontal growth up to $x_0$ can be carried out when factors of interrupting the horizontal growth are not present other than natural crystallization. However, in the actual horizontal growth, projections (defects or dirts of substrate) are present at a substrate or an underlayer and therefore, when the horizontal growth as far as the maximum horizontal growth distance is carried out, many defects are revealed.

Therefore, there is provided a condition in respect of hazard of horizontal growth such as projections on a substrate or an underlayer film or the like. That is, when the density of projections is equal to or lower than a reciprocal number of a square of $x_0$, or, $g(T, f(T_0))^{-2}$, the factor of substantially interrupting the horizontal growth is limited to occurrence of nuclei caused by natural crystallization.

A substrate "a" having a surface roughness of 80 nm and a substrate "b" having a surface roughness of 5 nm are shown in FIGS. 1(C) and 1(D) and natural crystallization is liable to occur clearly in the case of the substrate "a". Further, the rate of horizontal growth is smaller in the case of the substrate "a". Typically, the rate of horizontal growth of the substrate "a" is about ⅔ times as much as that of the substrate "b". Accordingly, a substrate having a smaller surface roughness is more preferable in view of horizontal growth. However, since the maximum horizontal growth distance of the substrate "b" is larger by that amount, unless the density of projections of the substrate is made smaller in accordance therewith, the flatness cannot be utilized usefully.

Conversely, the maximum horizontal growth distance is smaller in the case of the substrate "a" and therefore, however smaller the density of projection of the substrate "a" than that of the substrate "b", it is difficult to promote the quality of crystals over a large area.

According to the present invention, as a method of measuring (a method of determining) a critical point of natural crystallization, observation by using an optical microscope, observation by using an electron microscope, observation by a spectroscopic method (for example, Raman spectroscopy) and the like are effective. However, caution is required to the fact that equations of relationships determined by the respective methods does not necessarily coincide with each other.

Further, in either of natural crystallization and horizontal growth, when thicknesses of a substrate, an underlayer and an amorphous silicon film, methods of film formation thereof, a cap film (a mask film) and the like are varied, the above-described relationship between temperature and time is also varied. Accordingly, in establishing a relationship equation "g", conditions the same as those of an object of an amorphous silicon film must be established. Further, in determining "f", it is effective to cover an amorphous silicon film with a mask film used in horizontal growth.

DETAILED DESCRIPTION OF THE PREFERRED EMBODIMENTS

Figure 6A:
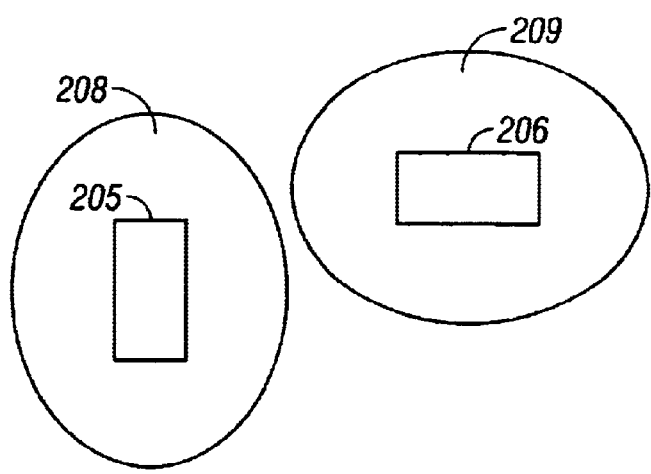
FIGS. 6(A), 6(B) and 6(C) show fabrication steps of TFTs (top view).
Figure 6B:
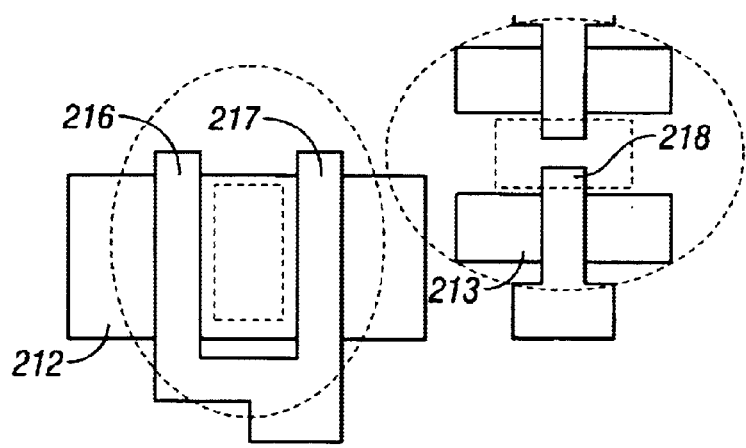
Figure 6C:
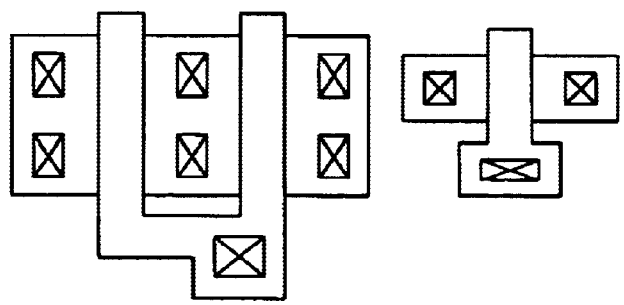

FIGS. 2(A), 2(B), 2(C), 2(D), 2(E) and 2(F) and FIGS. 6(A), 6(B) and 6(C) show fabrication steps according to an embodiment. FIGS. 2(A), 2(B), 2(C), 2(D), 2(E) and 2(F) and FIGS. 6(A), 6 (B) and 6(C) describe an outline of fabrication steps of a circuit where an N-channel type TFT and a P-channel type TFT for constituting a peripheral circuit are constituted in a complementary type and a circuit having an N-channel type TFT to be used for a pixel transistor. FIGS. 2(A), 2(B), 2(C), 2(D), 2(E) and 2(F) are sectional views and FIGS. 6(A), 6(B) and 6(C) are top views. Incidentally, although FIGS. 2(A), 2(B), 2(C), 2(D), 2(E) and 2(F) do not correspond to FIGS. 6(A), 6(B) and 6(C), numerals in these figures correspond to each other. First, an underlayer film 202 of silicon oxide having a thickness of 2000 Å is formed on a quartz substrate 201 the surface of which has been polished by plasma CVD (Chemical Vapor Deposition) process. At the stage of the surface polishing, the root mean square of a roughness of the substrate is set to 5 nm. Further, the density of projections after forming the underlayer film 202 is set to 100 pieces/cm$^2$ or lower. The density is measured by an atomic force microscope.

The numeral value is calculated from the horizontal growth distance of 100 μm necessary in the embodiment. In this embodiment, when the density of projections (dirts) is equal to or lower than, $$1/0.01^2 = 10000 \text{ pieces/cm}^2,$$

the influence of interruption of horizontal growth caused by projections may be regarded as smaller than the influence of interruption of horizontal growth caused by natural crystallization.

Further, an amorphous silicon film 203 having a thickness of 500 Å is formed by plasma CVD process. Next, a mask film 204 of silicon oxide having a thickness of 1000 through 3000 Å, for example, 2000 Å is formed, windows 205 and 206 are formed by etching portions for introducing a catalyst element (nickel) and portions of the amorphous silicon film are exposed.

Further, in proceeding to a next step, a number of the amorphous silicon films provided in the above-described steps are prepared. In that case, the method of fabricating the substrate, the underlayer film, the amorphous silicon film and the mask film remains unchanged. Then, the relationship equation t=f(T) is provided by measuring a relationship of temperature and time starting natural crystallization by using these films. According to the embodiment, the natural crystallization is determined by observation through an optical microscope. The atmosphere in that case is a nitrogen atmosphere similar to those in later crystallization steps.

Next, an extremely thin oxide film (thickness; several tens Å, not illustrated) is formed on the surface of the amorphous silicon film 203 which has been exposed by the above-described steps. This step is performed to prevent a solution from being repelled by the surface of the amorphous silicon film 203 in a later solution coating step. In forming the oxide film, the treatment is carried out by thermal oxidation process, irradiation of ultraviolet ray in an oxygen atmosphere, or by using a strongly oxidizing solution of hydrogen peroxide or the like.

A nickel acetate solution including nickel element constituting the catalyst element promoting crystallization, is coated thereafter by which an extremely thin film 207 of nickel acetate is formed on the surface of the amorphous silicon film 203. The film 207 is extremely thin and accordingly, the film may not be a complete film. The step is carried out by using spin coating process and spin dry process. The concentration (in term of weight) of nickel in the nickel acetate solution pertinently falls in a range of 1 through 100 ppm. The concentration is set to 10 ppm in this embodiment. (FIG. 2(A))

Next, the operation proceeds to an annealing step. Before the step a number of the amorphous silicon film (having mask film, windows for introducing nickel and nickel acetate film) are prepared under the same conditions of the above-described steps and a relationship between a horizontal growth rate and an annealing temperature is investigated by using these films. The atmosphere in this case is a nitrogen atmosphere the same as those of atmospheres in later crystallizing steps. In this way, the relationship equation x=g (T, t) is provided. The horizontal growth distance necessary in this embodiment is 100 μm.

Hence, $x^0 = 100(\mu m)$ is substituted for the equation, $$g(T, f(T)) = x_0,$$

by which the annealing temperature is obtained. T=680° C. in this embodiment. As a result, in this embodiment, the actual annealing temperature is determined as 645° C. which is 95% of the above-described annealing temperature.

Figure 1A:
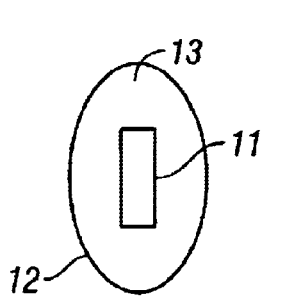
FIGS. 1(A), 1(B), 1(C) and 1(D) snow an outline of a method of determining annealing conditions according to the present invention.
Figure 1B:
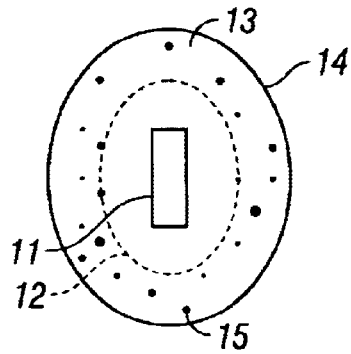
Figure 1C:
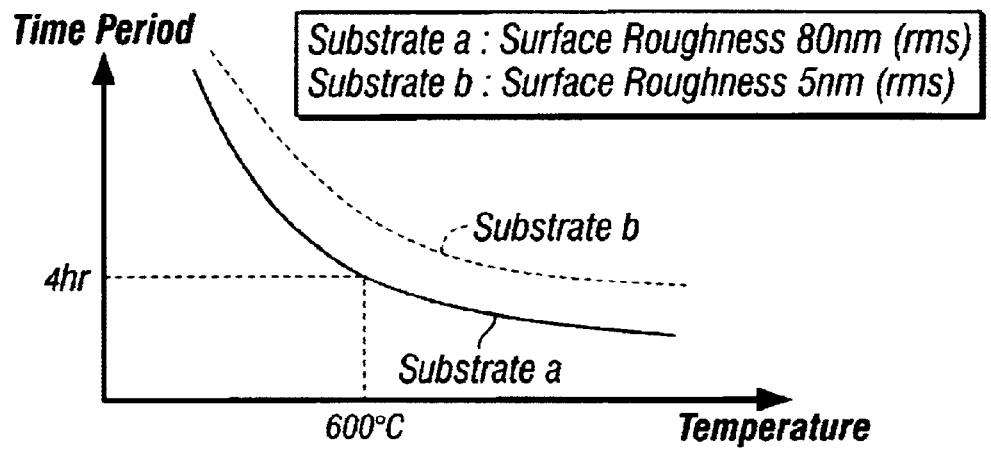
Figure 1D:
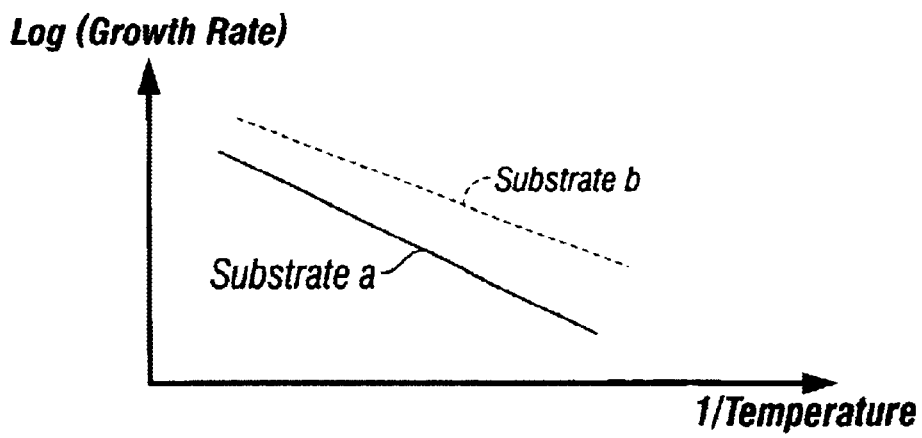
Figure 2A:
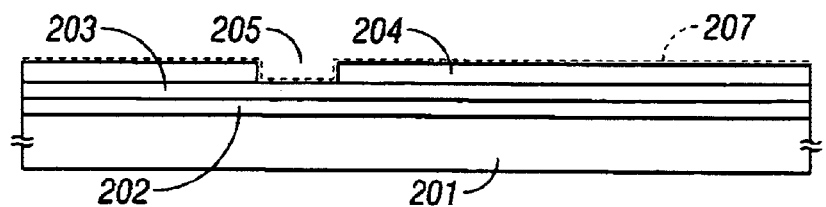
FIGS. 2(A), 2(B), 2(C), 2(D), 2(E) and 2(F) show fabrication steps of TFT according to an embodiment (sectional view)
Figure 2B:
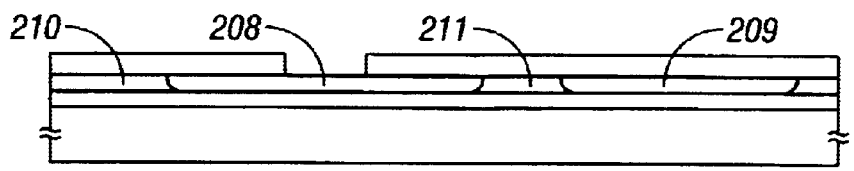
Figure 2C:
Figure 2D:
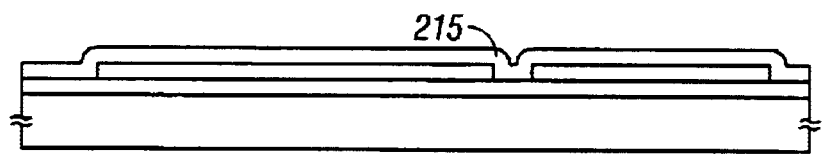
Figure 2E:
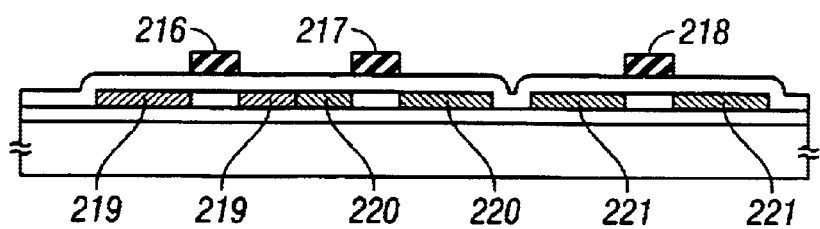
Figure 2F:
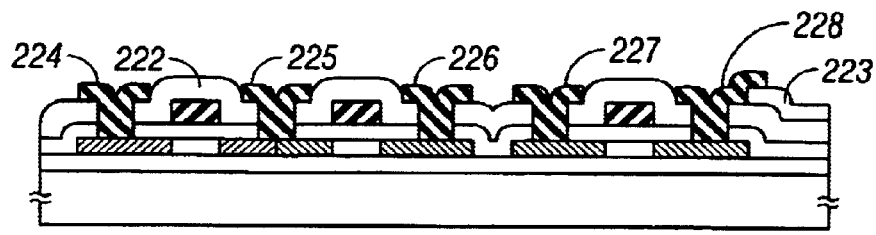
Figure 3:
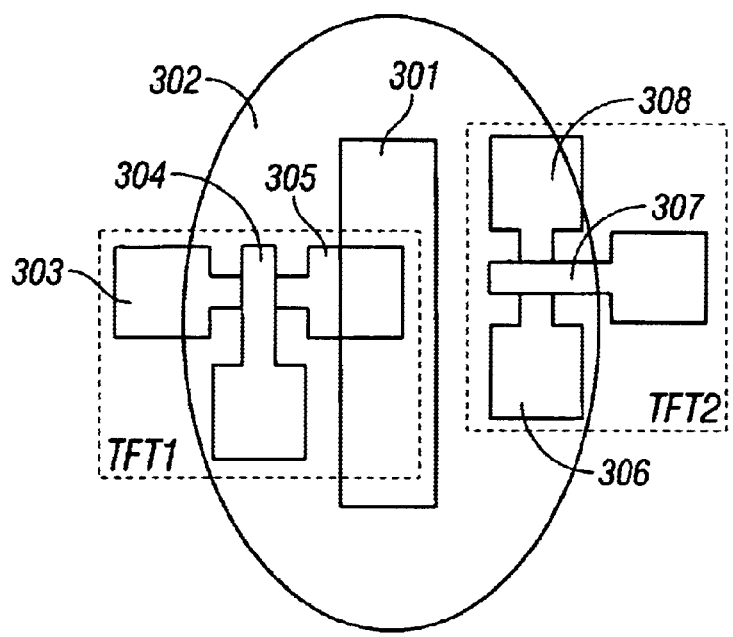
FIG. 3 shows an example of arranging TFTs and a horizontal growth region.
Figure 4A:
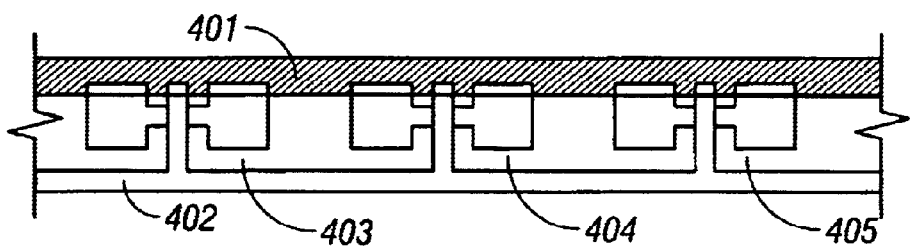
FIGS. 4(A) and 4(B) show examples of arranging TFTs and catalyst element adding regions.
Figure 4B:
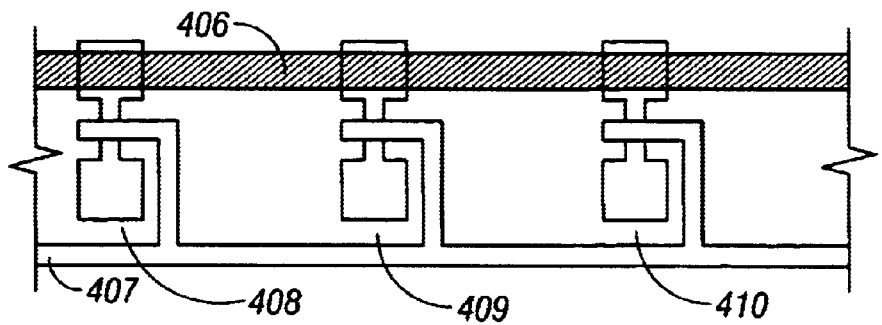
Figure 5:
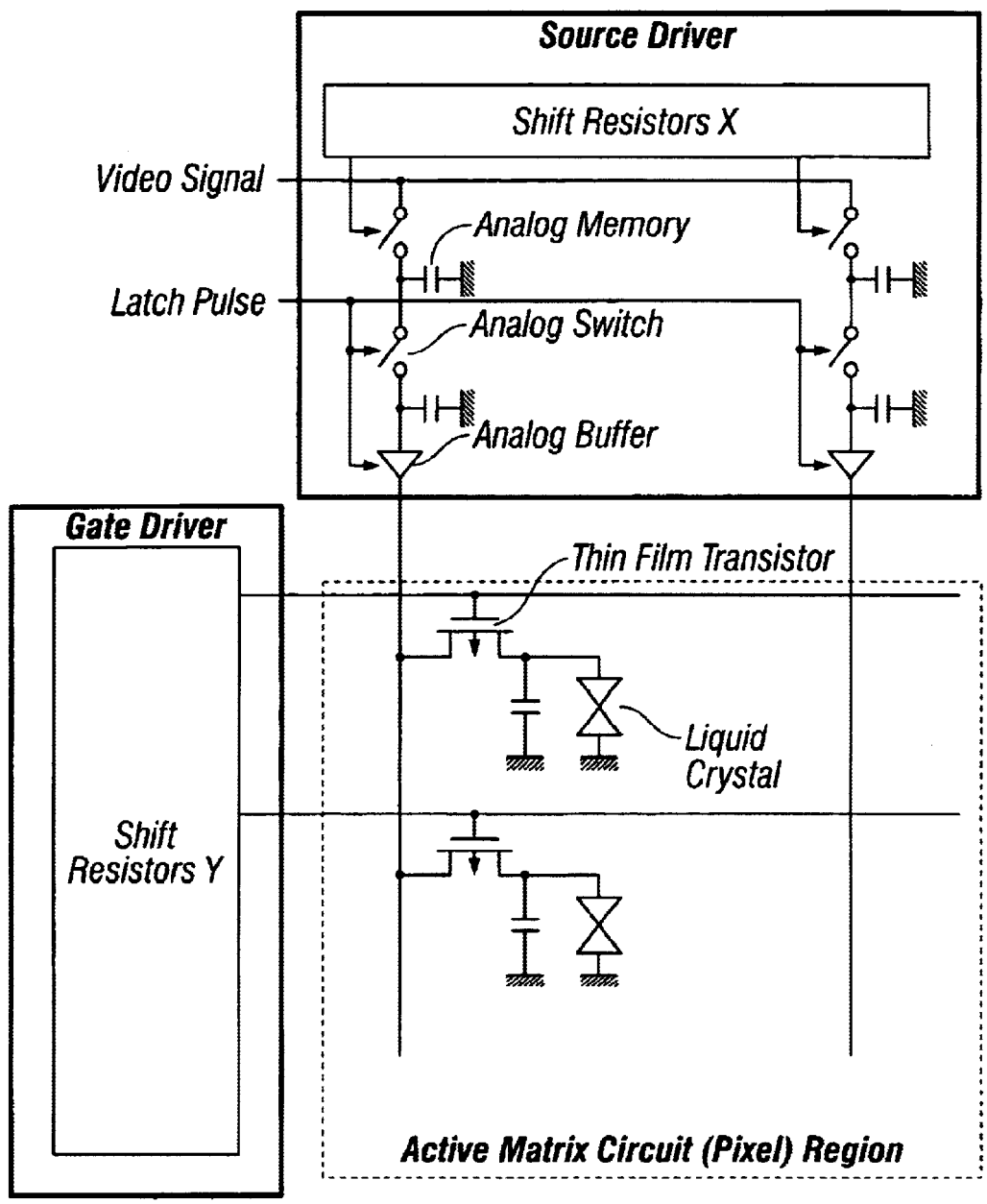
FIG. 5 shows an outline of a monolithic type active matrix circuit.

Thereafter, thermal annealing is carried out at 645° C. for 1 hour under a nitrogen atmosphere by which the silicon film 203 is crystallized. In the crystallizing process, crystal growth is progressed in a direction in parallel with the substrate with the region where nickel is brought into contact with the silicon film as a start point. In FIG. 2(B), regions 208 and 209 are crystallized regions by the step, and regions 210 and 211 are regions where amorphous silicon remains. FIG. 6(A) shows a behavior viewing the state from above. (FIG. 2(B) and FIG. 6(A))

Next, the silicon film 203 is etched and land-like activation layer regions 212 (complementary type circuit region) and 213 (pixel transistor region) are formed. In this case, regions directly below the windows 205 and 206 disposed at centers of ellipses in FIG. 6(A), are regions where nickel is directly introduced and regions where high concentration of nickel is present. Further, high concentration of nickel is also present at front ends of crystal growth of the regions 208 and 209. It has been revealed that in these regions, the concentration of nickel is higher than that in a crystallized region therebetween by substantially one digit.

Although the concentration of nickel in the silicon film is reduced in a later gettering step, it must be avoided to use these regions in major portions of an element. Accordingly, in this embodiment, it is necessary that the activation layer regions 212 and 213, particularly channel forming regions are arranged to avoid these regions having high nickel concentration. The etching of the activation layers is conducted by RIE (Reactive Ion Etching) process having the anisotropy in the vertical direction. A typical nickel concentration in the horizontal growth region at this stage is about $10^{17}$ through $10^{19}$ cm$^{-3}$.

Next, a thin (thickness; about 200 Å) silicon oxide film 214 is formed on the activation layers 212 and 213 by heating at 950 through 1150° C. in an oxidizing atmosphere. 0.1 through 10% of hydrogen chloride is mixed into the atmosphere. A portion of nickel present in the silicon film is gettered. (FIG. 2(C))

Thereafter, a silicon oxide film 215 having a thickness of 1000 Å is formed as a gate insulating film by plasma CVD process. In the film forming operation, dinitrogen oxide and tetraethoxy silane (TEOS) are used as raw material gases and the temperature of a substrate is set to 200 through 400° C., for example, 350° C. (FIG. 2(D)) Successively, a silicon film (including 0.1 through 2% of phosphorus) having a thickness of 3000 through 8000 Å, for example, 6000 Å, is formed by low pressure CVD process. Further, it is preferable to carry out continuously the steps of forming the preceding silicon oxide film 215 and the silicon film. Further, gate electrodes 216 through 218 are formed by etching the silicon film. FIG. 6(B) shows a behavior viewing a state from above. Ellipses shown by dotted lines of figure correspond to the regions 208 and 209 of FIG. 6(A). (FIG. 6(B))

Next, impurities (phosphorus and boron) are implanted to the activation layers with the gate electrodes 216 through 218 as masks by ion doping process. Phosphine (PH$_3$) and diborane (B$_2$H$_6$) are used as doping gases. In the former case, the acceleration voltage is set to 60 through 90 kV, for example, 80 kV and in the latter case, the acceleration voltage is set to 40 through 80 kV, for example, 65 kV. The amount of dose is set to $1 \times 10^{15}$ through $8 \times 10^{15}$ cm$^{-2}$, for example, phosphorus is set to $2 \times 10^{15}$ cm$^{-2}$ and boron is set to $5 \times 10^{15}$ cm$^{-2}$.

In the doping operation, the respective elements are selectively doped by covering regions where doping is not necessary by a photoresist. As a result, N-type impurity regions 220 and 221 and P-type impurity regions 219 are formed.

Thereafter, annealing is carried out by irradiating a laser beam by which the ion-implanted impurities are activated. Although KrF excimer laser (wavelength; 248 nm, pulse width; 20 nsec) is used as the laser beam, other laser may be used.

As conditions of irradiating the laser beam, the energy density is set to 200 through 400 mJ/cm$^2$, for example, 250 mJ/cm$^2$ and 2 through 10 shots, for example, 2 shots are allocated to one portion. When the substrate is heated at about 200 through 450° C. in irradiating the laser beam, the activation can be carried out more stably. (FIG. 2(E))

Successively, a silicon oxide film 222 having a thickness of 6000 Å is formed as an interlayer insulator by plasma CVD process. Further, an ITO (Indium Tin Oxide) film having a thickness of 500 Å is formed by sputtering process and the film is patterned by which a pixel electrode 223 is formed.

Further, contact holes (FIG. 6(C) shows positions of opening contact holes) are formed in the interlayer insulator 222 and electrode/wirings 224 through 228 of TFTs are formed by a metal material, for example, a multiple layer film of titanium nitride and aluminum. Finally, annealing is carried out at 350° C. for 30 minutes in a hydrogen atmosphere under 1 atmospheric pressure by which a TFT circuit is finished. (FIG. 2(F))

As is apparent also from FIG. 6(B), in the activation layer 212, the source/drain direction is in parallel with the direction of crystallization and meanwhile, in the activation layer 213, the source/drain direction is orthogonal to the direction of crystallization. As a result, in the case of TFT formed at the activation layer 212, ON current is large whereas in the case of TFT formed at the activation layer 213, OFF current is small. Although according to the embodiment, two kinds of TFTs having different characteristics are shown at the positions comparatively proximate to each other to make the embodiment easy to understand, they may be naturally fabricated at locations very remote from each other as in an active matrix circuit.

According to the present invention, preferable conditions for providing a crystalline silicon film where quality of crystals is not deteriorated even when the distance of horizontal growth is increased, has been clarified. As described above, the rate of horizontal growth is also promoted by using a flat underlayer film or a substrate. Such a silicon film is extremely advantageous in constituting a semiconductor element and a semiconductor integrated circuit as has been explained. In this way, the present invention is industrially useful.

What is claimed is:

1. A method of forming a crystalline semiconductor film comprising silicon for crystallizing an amorphous semiconductor film comprising silicon formed over a substrate by a horizontal growth process using a catalyst element promoting to crystallize the amorphous semiconductor film at an annealing temperature T$_o$, wherein a density of projections present at an underlayer film or the substrate in contact with a bottom face of the amorphous semiconductor film has a value specified below or lower;

$$g(T, f(T_0))^{-2}$$

wherein a relationship specified below is established between the annealing temperature and an annealing time period when the amorphous semiconductor film is formed on the substrate by the same process and the amorphous semiconductor film naturally starts crystallizing;

$$t = f(T) \ (T; \text{annealing temperature}, t; \text{annealing time period})$$

wherein a relationship specified below is established between the annealing temperature and a growth distance in the using the catalyst element promoting to crystallize the amorphous semiconductor film in respect of the amorphous semiconductor film formed on the substrate;

$$X=g(T, t) \ (x;\ \text{growth distance}).$$

2. A method according to claim 1, wherein the catalyst element is constituted by a single or a plurality of kinds of elements selected from the group consisting of Ni, Pd, Pt, Cu Ag and Fe.

3. A method of manufacturing a semiconductor device comprising the steps of:
 polishing a surface over a substrate;
 forming an insulating film comprising silicon oxide over the polished substrate;
 forming a semiconductor film comprising amorphous silicon over said insulating film;
 crystallizing the semiconductor film by heating; and
 patterning the crystallized semiconductor film to form an active layer,
 wherein the surface over said substrate is polished so that a root mean square of a surface roughness of said surfaces is smaller than a thickness of the semiconductor film and a density of projection on said surface is 100 pieces/cm$^2$ or less.

4. A method of manufacturing a semiconductor device comprising the steps of:
 polishing a surface over a substrate;
 forming an insulating film comprising silicon oxide over the polished substrate;
 forming a semiconductor film comprising amorphous silicon over said insulating film;
 providing a selected portion of said semiconductor film with a crystallization promoting; material;
 crystallizing the semiconductor film by heating wherein crystals grow from said selected portion to a region adjacent to said selected portion; and
 patterning the crystallized semiconductor film to form an active layer,
 wherein the surface over said substrate is polished so that a toot mean square of a surface roughness of said surfaces is smaller than a thickness of the semiconductor film.

5. The method according to claim 4 wherein said crystallization promoting material comprises a metal selected from the group consisting of Ni, Pd, Pt, Cu, Ag and Fe.

6. A method of manufacturing a semiconductor device comprising the steps of:
 forming a semiconductor film comprising amorphous silicon on an insulating surface;
 providing a selected portion of said semiconductor film with a crystallization promoting material;
 crystallizing the semiconductor film by heating at a temperature $T_0$, wherein crystals grow from said selected portion to a region adjacent to said selected portion; and
 patterning the crystallized semiconductor film to form an active layer of a thin film transistor,
 wherein a density of projections present at the insulating surface has a value specified below or lower;

$$g(T, f(T_0))^{-1}$$

wherein a relationship specified below is established between the heating temperature and a heating; time period when the semiconductor film is formed on the insulating surface by the same process and the semiconductor film naturally starts crystallizing;

$$t=f(T) \ (T;\ \text{annealing temperature t; annealing time period})$$

wherein a relationship specified below is established between the heating temperature and a growth distance from said selected portion to a region adjacent to said selected portion to crystallize the semiconductor film in respect of the semiconductor film formed on the insulating surface:

$$X=g(T,t) \ X=\text{growth } e(T, t) \text{ distance}.$$

7. The method of claim 6 wherein said crystallization promoting material comprises a metal selected from the group consisting of Ni, Pd, Pt, Cu, Ag and Fe.

8. A method of manufacturing a Semiconductor device comprising the steps of:
 polishing a surface of an insulating surface;
 forming a semiconductor film comprising amorphous silicon on the insulating surface by a film formation method;
 providing a selected portion of said semiconductor film with a crystallization promoting material;
 crystallizing the semiconductor film by heating at a temperature $T_0$, wherein crystals grow from said selected portion to a region adjacent to said selected portion; and
 patterning the crystallized semiconductor film to form an active layer of a thin film transistor,
 wherein a density of projections present at the insulating surface has a value specified below or loser;

$$g(T,f(T_0))^{-1}$$

wherein a relationship specified below is established between the heating temperature and a heating time period when the semiconductor film is formed on the insulating surface by said film formation method and the semiconductor film naturally starts crystallizing;

$$t=f(T) \ (T;\ \text{annealing temperature, t; annealing time period})$$

wherein a relationship specified below is established between the heating temperature and a growth distance from said selected portion to a region adjacent to said selected portion to crystallize the semiconductor film in respect of the semiconductor film formed on the insulating surface:

$$X=g(T, t) \ (x;\ \text{growth distance}).$$

9. The method according to claim 8 wherein said crystallization promoting material comprises a metal selected from the group consisting of Si, Pd, Pt, Cu, Ag and Fe.

10. A method of manufacturing a semiconductor device comprising the steps of:
 polishing a surface of an insulating surface;
 forming a semiconductor film comprising amorphous silicon on the insulating surface by a film formation method;
 crystallizing the semiconductor film by horizontal growth process to crystallize the semiconductor film at a heating temperature $T_0$; and patterning the crystallized semiconductor film to form an active layer of a thin film transistor, wherein a density of projections present at the insulating surface has a value specified below or lower;

$$g(T, f(T_0))^{-2}$$

wherein a relationship specified below is established between the heating temperature and a heating time period when the semiconductor film is formed on the insulating surface by said film formation method and the semiconductor film naturally starts crystallizing;

$$t=f(T) \;(T; \text{annealing temperature}, t; \text{annealing time period})$$

wherein a relationship specified below is established between the heating temperature and a growth distance in the horizontal growth;

$$X=g(T, t) \;(x; \text{growth distance}).$$

11. A method of manufacturing a semiconductor device comprising the steps of:

polishing a surface over a substrate;

forming a semiconductor film comprising amorphous silicon over the polishing substrate;

providing a solution comprising a metal containing material for promoting crystallization of the semiconductor film over said semiconductor film;

crystallizing the semiconductor film by heating; and patterning the crystallized semiconductor film to form an active layer, wherein the surface over said substrate is polished so that a root mean square of a surface roughness of said surfaces is smaller than a thickness of the semiconductor film and a density of projection on said surface is 100 pieces/$cm_2$ or less.

12. A method of manufacturing a semiconductor device comprising the steps of:

polishing a surface over a substrate;

forming a semiconductor film comprising amorphous silicon over the polishing substrate;

providing a solution comprising a metal containing material for promoting crystallization of the semiconductor film over said semiconductor film;

crystallizing the semiconductor film by heating wherein crystals grow from said selected portion to a region adjacent to said selected portion; and patterning the crystallized semiconductor film to form an active layer;

wherein the surface over said substrate is polished so that a root mean square of a surface roughness of said surfaces is smaller than a thickness of the semiconductor film.

* * * * *